United States Patent
Sahu et al.

(10) Patent No.: US 10,418,309 B1
(45) Date of Patent: Sep. 17, 2019

(54) MECHANICAL SEAL AND RESERVOIR FOR MICROELECTRONIC PACKAGES

(71) Applicant: Intel Corporation, Santa Clara, CA (US)

(72) Inventors: Bijoyraj Sahu, Portland, OR (US); Thomas A. Boyd, Vancouver, WA (US); Jeffory L. Smalley, East Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/018,760

(22) Filed: Jun. 26, 2018

(51) Int. Cl.
- *H01L 23/40* (2006.01)
- *H01L 21/48* (2006.01)
- *H01L 23/367* (2006.01)

(52) U.S. Cl.
CPC ...... *H01L 23/4093* (2013.01); *H01L 21/4882* (2013.01); *H01L 23/3672* (2013.01)

(58) Field of Classification Search
CPC ............ H01L 21/4882; H01L 23/3672; H01L 23/4093
See application file for complete search history.

(56) References Cited

U.S. PATENT DOCUMENTS

| | | | | |
|---|---|---|---|---|
| 5,109,318 A * | 4/1992 | Funari | ............... | H05K 7/20509 257/713 |
| 6,390,475 B1 * | 5/2002 | Eckblad | ............... | F16J 15/064 165/80.3 |
| 6,528,878 B1 * | 3/2003 | Daikoku | ............... | H01L 23/10 257/714 |
| 7,323,358 B1 * | 1/2008 | Cromwell | .......... | H01L 23/4093 257/678 |
| 8,258,013 B1 * | 9/2012 | Nagarajan | ............ | H01L 23/564 257/678 |
| 2003/0123231 A1 * | 7/2003 | Shah | .................. | G01R 31/2884 361/748 |
| 2004/0252462 A1 * | 12/2004 | Cromwell | .......... | H01L 23/4093 361/719 |
| 2007/0211445 A1 * | 9/2007 | Robinson | ............. | H01L 23/552 361/818 |
| 2017/0112005 A1 * | 4/2017 | Cole | .................... | H01L 25/115 |

\* cited by examiner

*Primary Examiner* — Allan R Wilson
(74) *Attorney, Agent, or Firm* — Schwegman Lundberg & Woessner, P.A.

(57) ABSTRACT

Described herein are microelectronics packages and methods for manufacturing the same. The microelectronics package may include a substrate, a first die, a gasket, and a thermal interface. The first die may be connected to the substrate. The gasket may be connected to the substrate and may encircle the first die to form a space between the first die and the gasket. The thermal interface material may be located within the space formed by the first die and the gasket.

20 Claims, 5 Drawing Sheets

MECHANICAL SEAL AND RESERVOIR FOR MICROELECTRONIC PACKAGES

TECHNICAL FIELD

Embodiments described generally herein relate to microelectronic packages and microelectronic packages manufacturing. Some embodiments relate to using a mechanical seal and reservoir for use in microelectronic packages.

BACKGROUND

A microelectronics package may include a plurality of die. During operations, the plurality of die may generate heat. The heat generated needs to be removed to prevent the plurality of die from overheating.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Thermal interface materials (TIMs) may be used to attach and thermally bridge heat sinks to a silicon chip. TIMs may minimize the thermal resistance between the heat generating component (e.g., the silicon chip) and the heat sink. Therefore, thickness and uniformity of TIM across the die (referred to as bond line thickness BLT) may have significant impact on the operating temperature and performance of the silicon chip. Any variability in TIM thermal resistance also may significantly affect the reliability performance of the silicon chip.

One of the challenges affecting TIM thermal resistance is pump-out and dry-out of TIM material during high temperature cycles in the assembly process and also during end use conditions (e.g., thermal and power cycling). The pump-out and dry out is caused due to package warpage during the thermal and power cycles. A package can warp into concave and convex shapes resulting in TIM pump out and creation of voids. The voids result in inefficient heat transfer due to air being trapped in the TIM. These voids increase the thermal resistance of the TIM and distribution of the voids across the die increases the variability in TIM thermal resistance. Typically, thermal resistance of the TIM material is higher in corner and edge locations of the die as compared to the center location. The increased TIM resistance affects the system reliability, product performance, and thermal platform cost. Further, the variability in TIM resistance may necessitate keeping thermal headroom margins and thus capping processor performance limits.

Another challenge for bare die packages (i.e., packages without an integrated heat spreader (IHS) is corner or edge loading of the silicon chip leading to chip cracking. The corner loading or edge loading can occur during loading the heat sink and may be applied by a retention mechanism.

As disclosed herein, a mechanical sealing and reservoir design may be used to prevent TIM thermal performance degradation due to pump out and dry-out challenges described above. The sealing is also designed to avoid bare die cracking under mechanical loads.

As disclosed herein, a gasket may be used to construct a thermal interface material (TIM) mechanical sealing and reservoir that may be employed to prevent pump-out and dry-out of TIM during thermal and power cycling of the package under assembly and use conditions. Embodiments include a TIM reservoir that may provide a gas free reservoir that allows replenishment of TIM material to hinder void formation. The mechanical sealing also may be employed to avoid bare die cracking under mechanical loads.

Figure 1:
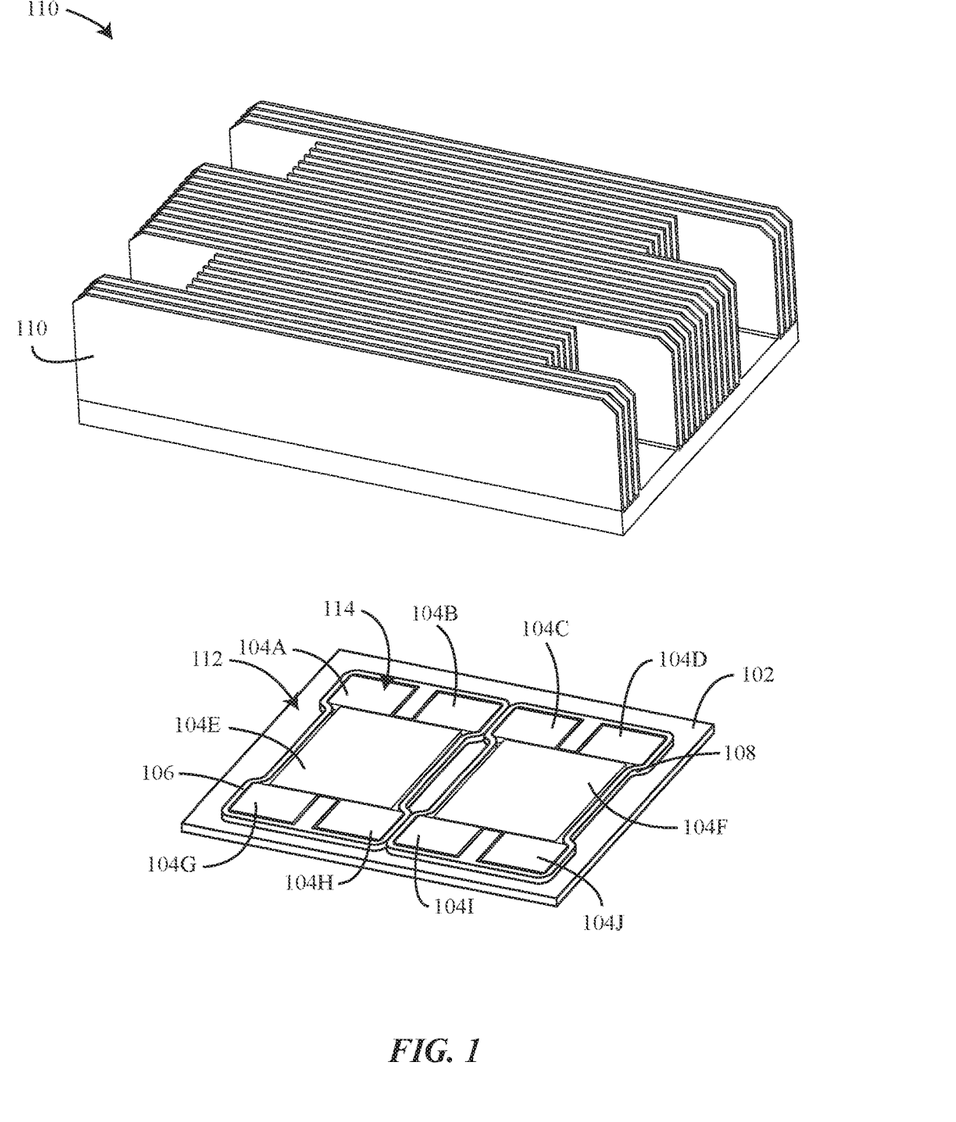
FIG. 1 illustrates microelectronics package in accordance with embodiments disclosed herein.

Turning now to the figures, FIG. 1 illustrates a microelectronics package 100 in accordance with embodiments disclosed herein. Microelectronics package 100 may include a substrate 102, dies 104A, 104B, 104C, 104D, 104E, 104F, 104G, 104H, 104I, and 104J (collectively dies 104), a first gasket 106, a second gasket 108, and a heat sink 110. Dies 104 may be connected to substrate 102. First gasket 106 may be connected to substrate 102 and encircle one or more of the dies 104. Second gasket 106 may be connected to substrate 102 and encircle one or more of the dies 104.

Dies 104 may have die heights that are the same or different between the various dies 104. For example, dies 104A, 104B, 104G, and 104H may have a first die height and die 104E may have a second die height. The first die height may be the same, greater than, or less than the second die height. Dies 104C and 104D may have a third die height, dies 104I and 104J may have a fourth die height, and die 104F may have a firth die height. The third die height, fourth die height, and firth die height may be the same, less than, or greater than one another. The die heights may be the height of a top surface of a die with respect to substrate 102. For example, the first die height may be a distance from atop surface 112 of substrate 102 and atop surface 114 of die 104A.

First gasket 106 may have a first gasket height and second gasket 106 may have a second gasket height. The first gasket height may be the same, less than, or greater than the second gasket height. In addition, the first gasket height and the second gasket height may be greater than the die heights. For example, the gasket heights may be about 50% greater than the die heights. The gasket heights may be the height of a top surface of first gasket 106 and second gasket 106 from top surface 112 of substrate 102.

As disclosed herein, first gasket 106 and second gasket 108 may be made of a flexible and/or compressible material. As such, because the gasket heights may be greater than the die heights, when heat sink 110 is attached to the dies 104 or first gasket 106 and second gasket 108, first gasket 106 and second gasket 108 may compress or otherwise deform to match a contour of heat sink 110 and a contour of substrate 102. Having first gasket 106 and second gasket 108 conform to contours of heat sink 110 and substrate 102 may allow first gasket 106 and second gasket 108 to form an air tight seal to prevent a thermal interface material located within a space formed by surfaces of dies 105 and first gasket 106 and second gasket 108 from escaping the space.

Figure 2:
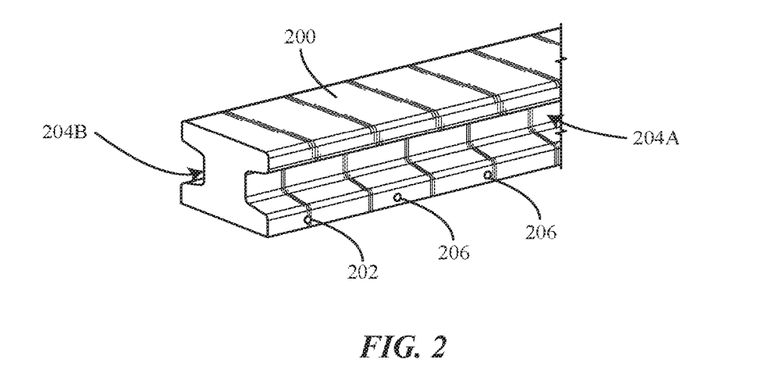
FIG. 2 illustrates a gasket in accordance with embodiments disclosed herein.

FIG. 2 shows a gasket 200, such as first gasket 106 or second gasket 108. Gasket 200 may be made of a flexible and/or compressible material. The flexible nature of gasket 200 may allow gasket 200 to form a perimeter around dies 104. Gasket 200 may be manufactured to have one or more concave surface 204A and 204B (collectively concave surfaces 204). As such, gasket 200 may have an I-beam profile as shown in FIG. 2. Gasket 200 may also define one or more vent holes 206. Vent holes 206 may pass through gasket 200 so as to allow air to flow through gasket 200 as disclosed herein.

Figure 3A:
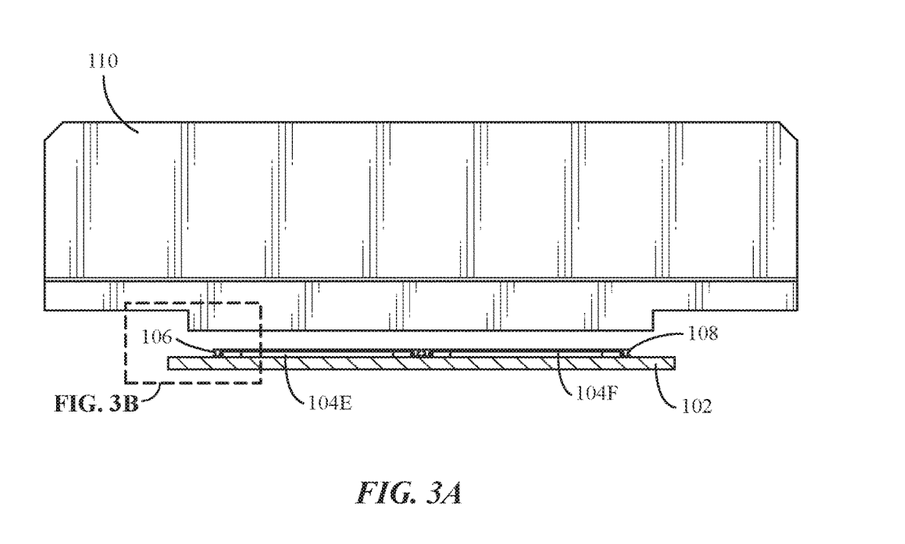
FIGS. 3A, 3B, and 3C illustrate side views of a microelectronics package in accordance with embodiments disclosed herein.
Figure 3B:
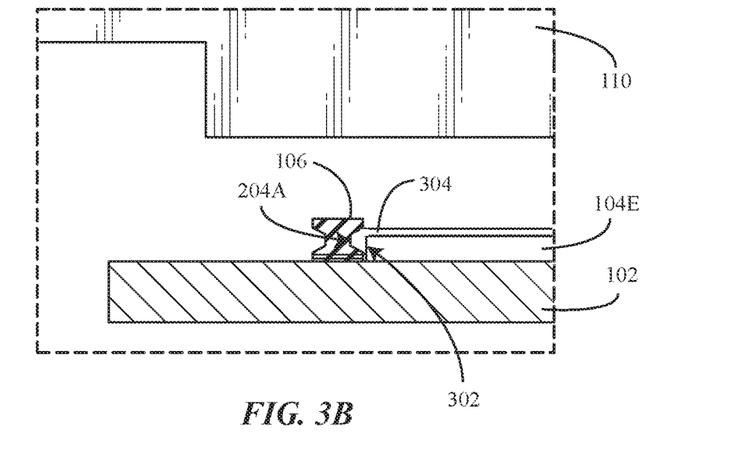
Figure 3C:
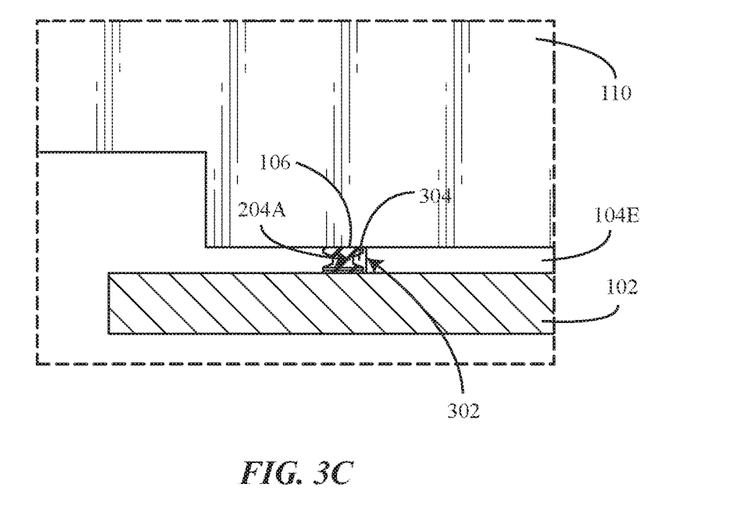

FIGS. 3A-3C show side views of microelectronics package 100. As shown in FIG. 3B, first gasket 106 may be taller than die 104E. As shown in FIG. 3C, when heat sink 110 is attached, first gasket 106 may compress to conform to surfaces of heat sink 110 and substrate 102 as disclosed herein. As shown in FIG. 3B, concave surface 204A and a side wall 302 may form a space or reservoir that may house a thermal interface material 304. In addition, a layer of thermal interface material 304 may be applied to a top surface of die 104E.

As disclosed herein, during operation of microelectronics package 100 thermal conditions caused by higher power consumption or other usage may cause expansion of dies 104, heat sink 110, substrate 102, etc. Because the various components of microelectronics package 100 are made of different materials, the expansion of the components may cause delamination, warping cracking etc. due to the differing coefficient of thermal expansion of each component, as well as thermal gradients that may develop within the various components. Because vent holes 206 can allow air to flow into the space in between surface 204A and surface 302 proximate surface 204A, thermal interface material 304 can flow around dies 104. As a result, voids in thermal interface material 304 may be avoided and thermal management may be improved due to thermal interface material 304 contacting both dies 104 and heat sink 110.

As disclosed herein, gasket sealing is also designed to avoid bare die cracking under mechanical loads. For example, load concentrations can occur during attachment of heat sink 110. Any tilt of heat sink 110 during attachment of heat sink 110 is a high risk for the bare die cracking. However, a mechanical sealing enclosing die 104 as disclosed herein can avoid bare die cracking as gasket 200 becomes a first contact point and takes the load before the load is gradually transferred to die 104 as gasket 200 gets compressed.

Figure 4:
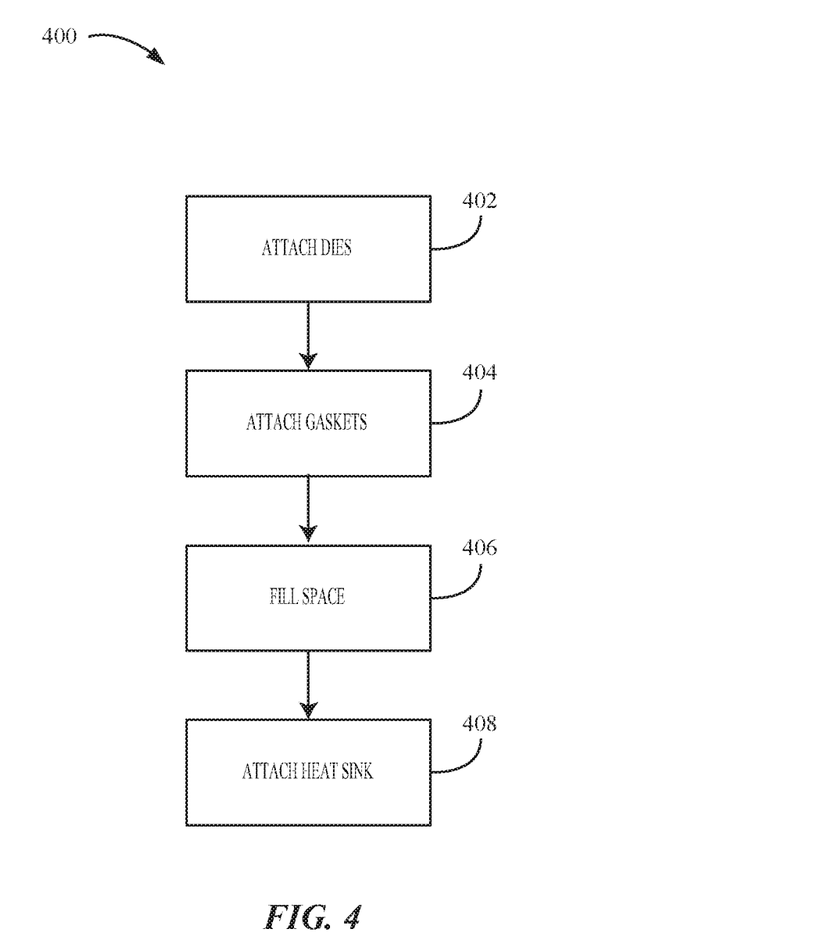
FIG. 4 illustrates an example method for manufacturing a microelectronics package in accordance with embodiments disclosed herein.

FIG. 4 illustrates an example method 400 flow for manufacturing a microelectronics package, such as microelectronics package 100 in accordance with embodiment disclosed herein. Method 400 may begin at stage 402 where dies, such as one or more of dies 104, may be attached to a substrate, such as substrate 102. As disclosed herein, the dies may be attached in close proximity to one another or spaced from one another.

From stage 402 method 400 may proceed to stage 404 where gaskets, such as gasket 200 may be attached to the substrate. As disclosed herein, the gaskets may encircle one or more of the dies. In addition, the gaskets may be spaced a distance from the dies so as to form a space in between the gaskets and the dies. The distance between the gaskets and the dies may be uniform or vary so that the space may have a uniform cross section.

From stage 404 method 400 may proceed to stage 406 where the sp ace formed in between the gaskets and the dies may be filed with a thermal interface material, such as thermal interface material 304. In addition to filling the space, the thermal interface material may also cover the top of the dies so as to fill a space created by the top of the dies and a bottom surface of a heat sink, such as heat sink 110.

From stage 406 method 400 may proceed to stage 408 where the heat sink may be attached to the gasket and dies. As the heat sink is attached to the dies some of the thermal interface material that is located on top of the dies may be forced into the space formed by the gaskets and the dies. In addition, installation of the heat sink may cause the gaskets to compress or otherwise deform so that the top of the gasket conforms to the bottom of the heat sink.

Figure 5:
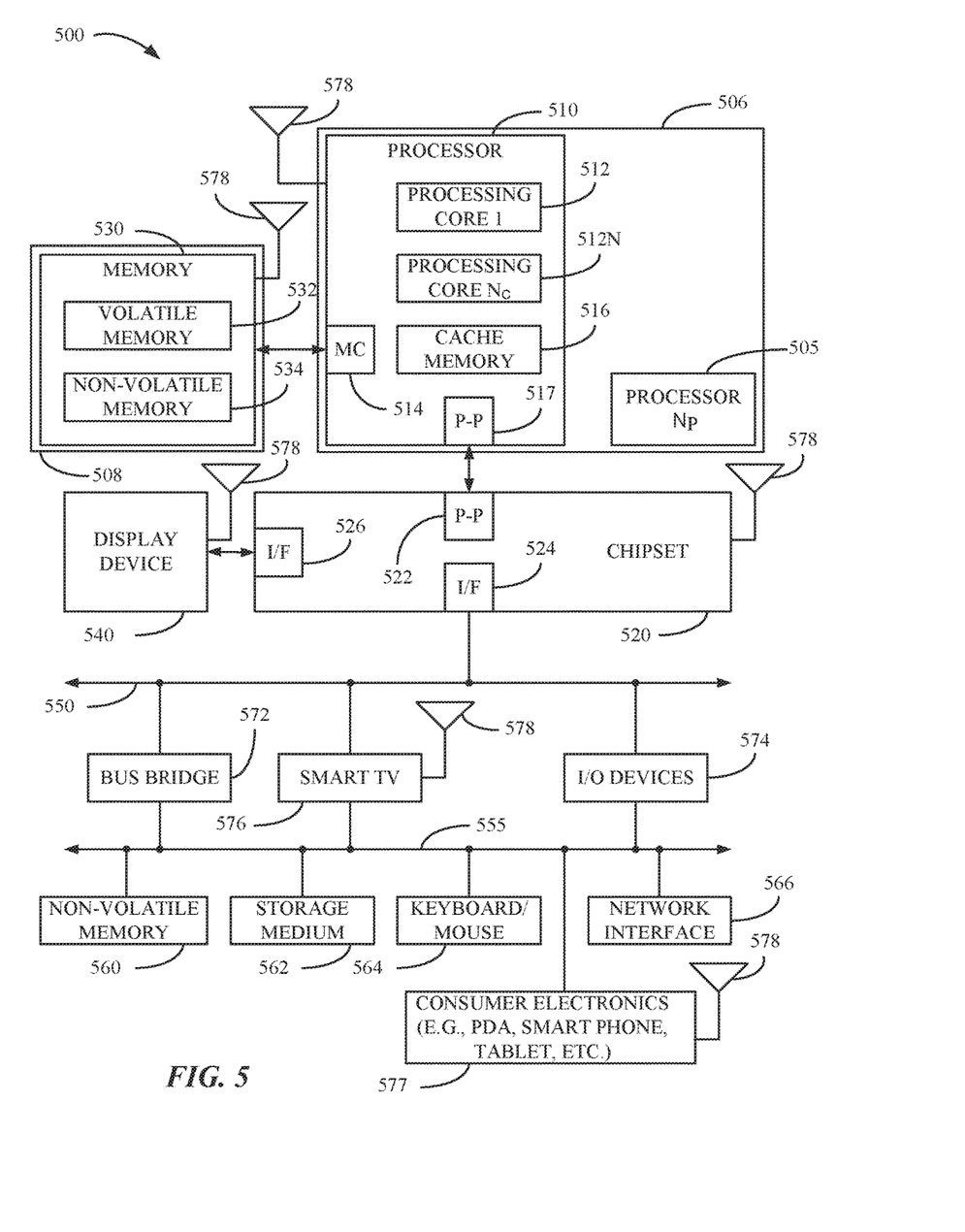
FIG. 5 illustrates an example schematic of a computing device in accordance with embodiments disclosed herein.

FIG. 5 illustrates a system level diagram, according to one embodiment of the invention. For instance, FIG. 5 depicts an example of an electronic device (e.g., system) including the microelectronics package 100. FIG. 5 is included to show an example of a higher level device application for the present invention. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart p hone, an Internet appliance or any other type of computing device. In some embodiments, system 500 is a system on a chip (SOC) system.

In one embodiment, processor 510 has one or more processing cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol. As disclosed herein, processor 510 and processor 505 may be encircled by a gasket 506.

In some embodiments, volatile memory 532 includes, hut is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used. As disclosed herein a gasket 508 may encircle memory 530.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In one embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

ADDITIONAL NOTES & EXAMPLES

Example 1 is a microelectronics package comprising: a substrate; a first die connected to the substrate; a gasket connected to the substrate and encircling the die to form a space between the first die and the gasket; and a thermal interface material located within the space formed by the first die and the gasket.

In Example 2, the subject matter of Example 1 optionally includes wherein the gasket has a gasket height and the first die has a die height, the gasket height being greater than the die height.

In Example 3, the subject matter of Example 2 optionally includes wherein the gasket height is up to 50% greater than the die height.

In Example 4, the subject matter of any one or more of Examples 1-3 optionally include wherein a sidewall of the gasket facing the first die has a concave profile.

In Example 5, the subject matter of any one or more of Examples 1-4 optionally include wherein the gasket has an I-beam profile.

In Example 6, the subject matter of any one or more of Examples 1-5 optionally include wherein the gasket is flexible.

In Example 7, the subject matter of any one or more of Examples 1-6 optionally include wherein the gasket is compressible.

In Example 8, the subject matter of any one or more of Examples 1-7 optionally include wherein the gasket defines a vent hole proximate the substrate, the vent hole sized to allow air to pass into the space formed by the gasket and the first die.

In Example 9, the subject matter of any one or more of Examples 1-8 optionally include a heat sink attached to the gasket opposite the substrate.

In Example 10, the subject matter of Example 9 optionally includes wherein the thermal interface material is further located in a space formed by the heat sink and a top surface of the first die.

In Example 11, the subject matter of any one or more of Examples 1-10 optionally include a second die located proximate the first die, the gasket partially filling a space formed by the first die and the second die, the thermal interface material filling a space formed by the second die and the gasket.

Example 12 is a microelectronics package comprising: a substrate; a first gasket connected to the substrate and forming a first zone; a first plurality of dies connected to the substrate and located within the first zone; a first thermal interface material located within a first space formed by the first plurality of dies and the first gasket; a second gasket connected to the substrate and forming a second zone, the second zone fluidly isolated from the first zone; a second plurality of dies connected to the substrate and located within the second zone; and a second thermal interface material located within a second space formed by the second plurality of dies and the second gasket.

In Example 13, the subject matter of Example 12 optionally includes wherein the first gasket has a first gasket height and the first plurality of dies has a first die height, the first gasket height being greater than the first die height, and the second gasket has a second gasket height and the second plurality of dies has a second die height, the second gasket height being greater than the second die height.

In Example 14, the subject matter of Example 13 optionally includes wherein the gasket height is up to 50% greater than the die height.

In Example 15, the subject matter of any one or more of Examples 13-14 optionally include wherein the first die height and the second die height are equal and the first gasket height and the second gasket height are equal.

In Example 16, the subject matter of any one or more of Examples 13-15 optionally include wherein the first die height and the second die height are equal and the first gasket height and the second gasket height are not equal.

In Example 17, the subject matter of any one or more of Examples 13-16 optionally include wherein the first die height and the second die height are not equal and the first gasket height and the second gasket height are equal.

In Example 18, the subject matter of any one or more of Examples 13-17 optionally include wherein the first die height and the second die height are not equal and the first gasket height and the second gasket height are not equal.

In Example 19, the subject matter of any one or more of Examples 12-18 optionally include wherein a sidewall of the first gasket facing the first plurality of dies and a sidewall of the second gasket facing the second plurality of dies each has a concave profile.

In Example 20, the subject matter of any one or more of Examples 12-19 optionally include wherein the first gasket and the second gasket each has an I-beam profile.

In Example 21, the subject matter of any one or more of Examples 12-20 optionally include wherein the first gasket and the second gasket each is flexible.

In Example 22, the subject matter of any one or more of Examples 12-21 optionally include wherein the first gasket and the second gasket each is compressible.

In Example 23, the subject matter of any one or more of Examples 12-22 optionally include wherein the first gasket and the second gasket each defines a vent hole proximate the substrate, the vent holes sized to allow air to pass into the first zone and second zone, respectively.

In Example 24, the subject matter of any one or more of Examples 12-23 optionally include a heat sink attached to the first gasket and the second gasket opposite the substrate.

In Example 25, the subject matter of Example 24 optionally includes wherein the first thermal interface material is further located in a sp ace formed by the heat sink and a second plane defined by top surfaces of the first plurality of dies and the second thermal interface material is located a space formed by the heat sink and a second plane defined by top surface of the second plurality dies.

Example 26 is a method of manufacturing a microelectronics package, the method comprising: attaching a first die to a substrate; attaching a first gasket to the substrate so that the first gasket encircles the first die; and filling a space formed by the first gasket and surfaces of the first die proximate the first gasket with a thermal interface material.

In Example 27, the subject matter of Example 26 optionally includes forming one or more vent holes in the first gasket.

In Example 28, the subject matter of any one or more of Examples 26-27 optionally include attaching a heat sink to the first gasket.

In Example 29, the subject matter of Example 28 optionally includes wherein attaching the heat sink includes compressing the first gasket.

In Example 30, the subject matter of any one or more of Examples 26-29 optionally include attaching a second die to the substrate proximate the first die, the first gasket encircling both the first die and the second die.

In Example 31, the subject matter of any one or more of Examples 26-30 optionally include attaching a second die to the substrate; attaching a second gasket to the substrate so that the second gasket encircles the second die; and filling a second space formed by the second gasket and surfaces of the second die proximate the second gasket with a second thermal interface material.

Example 32 is a method of manufacturing a microelectronics package, the method comprising: attaching a first plurality of dies to a substrate; attaching a first gasket to the substrate so that the first gasket encircles the first plurality of dies; filling a first space formed by the first gasket and surfaces of the first plurality of dies proximate the first gasket with a thermal interface material.

In Example 33, the subject matter of Example 32 optionally includes forming one or more vent holes in the first gasket and the second gasket.

In Example 34, the subject matter of any one or more of Examples 32-33 optionally include attaching a heat sink to the first gasket and the second gasket.

In Example 35, the subject matter of Example 34 optionally includes wherein attaching the heat sink includes compressing the first gasket and second gasket.

The above detailed description includes references to the accompanying drawing, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A microelectronics package comprising:
   a substrate;
   a first die connected to the substrate;
   a gasket connected to the substrate and encircling the die to form a space between the first die and the gasket, the gasket defining a vent hole proximate the substrate, the vent hole sized to allow air to pass into the space formed by the gasket and the first die; and
   a thermal interface material located within the space formed by the first die and the gasket.

2. The microelectronics package of claim 1, wherein the gasket has a gasket height and the first die has a die height, the gasket height being greater than the die height.

3. The microelectronics package of claim 2, wherein the gasket height is up to 50% greater than the die height.

4. The microelectronics package of claim 1, wherein a sidewall of the gasket facing the first die has a concave profile.

5. The microelectronics package of claim 1, wherein the gasket has an I-beam profile.

6. The microelectronics package of claim 1, wherein the gasket is flexible.

7. The microelectronics package of claim 1, wherein the gasket is compressible.

8. The microelectronics package of claim 1, further comprising a heat sink attached to the gasket opposite the substrate.

9. The microelectronics package of claim 8, wherein the thermal interface material is further located in a space formed by the heat sink and a top surface of the first die.

10. The microelectronics package of claim 1, further comprising a second die located proximate the first die, the gasket partially filling a space formed by the first die and the second die, the thermal interface material filling a space formed by the second die and the gasket.

11. A microelectronics package comprising:
    a substrate;
    a first gasket connected to the substrate and forming a first zone;
    a first plurality of dies connected to the substrate and located within the first zone;
    a first thermal interface material located within a first space formed by the first plurality of dies and the first gasket;
    a second gasket connected to the substrate and forming a second zone, the second zone fluidly isolated from the first zone;
    a second plurality of dies connected to the substrate and located within the second zone; and
    a second thermal interface material located within a second space formed by the second plurality of dies and the second gasket.

12. The microelectronics package of claim 11, wherein the first gasket has a first gasket height and the first plurality of dies has a first die height, the first gasket height being greater than the first die height, and the second gasket has a second gasket height and the second plurality of dies has a second die height, the second gasket height being greater than the second die height.

13. The microelectronics package of claim 11, wherein a sidewall of the first gasket facing the first plurality of dies and a sidewall of the second gasket facing the second plurality of dies each has a concave profile.

14. The microelectronics package of claim 11, wherein the first gasket and the second gasket each defines a vent hole proximate the substrate, the vent holes sized to allow air to pass into the first zone and second zone, respectively.

15. The microelectronics package of claim 11, further comprising a heat sink attached to the first gasket and the second gasket opposite the substrate.

16. A method of manufacturing a microelectronics package, the method comprising:
    attaching a first die to a substrate;
    attaching a first gasket to the substrate so that the first gasket encircles the first die;
    forming one or more vent holes in the first gasket; and
    filling a space formed by the first gasket and surfaces of the first die proximate the first gasket with a thermal interface material.

17. The method of claim 16, further comprising attaching a heat sink to the first gasket.

18. The method of claim 17, wherein attaching the heat sink includes compressing the first gasket.

19. The method of claim 16, further comprising attaching a second die to the substrate proximate the first die, the first gasket encircling both the first die and the second die.

20. The method of claim 16, further comprising:
    attaching a second die to the substrate;
    attaching a second gasket to the substrate so that the second gasket encircles the second die; and
    filling a second space formed by the second gasket and surfaces of the second die proximate the second gasket with a second thermal interface material.

* * * * *